(12) United States Patent
Seo et al.

(10) Patent No.: US 11,145,703 B2
(45) Date of Patent: Oct. 12, 2021

(54) DISPLAY DEVICE AND METHOD OF MANUFACTURING THE SAME

(71) Applicant: Samsung Display Co., LTD., Yongin-Si (KR)

(72) Inventors: Jongoh Seo, Seoul (KR); In Cheol Ko, Hwaseong-si (KR); Byung Soo So, Yongin-si (KR); Dong-min Lee, Yongin-si (KR); Dong-Sung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 16/677,042

(22) Filed: Nov. 7, 2019

(65) Prior Publication Data

US 2020/0152723 A1 May 14, 2020

(30) Foreign Application Priority Data

Nov. 8, 2018 (KR) .......................... 10-2018-0136245

(51) Int. Cl.
*H01L 27/15* (2006.01)
*H01L 27/32* (2006.01)
*H01L 51/56* (2006.01)
*H01L 51/00* (2006.01)

(52) U.S. Cl.
CPC ...... *H01L 27/3262* (2013.01); *H01L 51/0012* (2013.01); *H01L 51/0018* (2013.01); *H01L 51/0094* (2013.01); *H01L 51/56* (2013.01)

(58) Field of Classification Search
CPC ............. H01L 27/3262; H01L 51/0012; H01L 51/0018; H01L 51/0094; H01L 51/56
See application file for complete search history.

(56) References Cited

U.S. PATENT DOCUMENTS

| 2005/0263761 | A1* | 12/2005 | Kim ................... H01L 27/1248 257/57 |
| 2013/0146878 | A1* | 6/2013 | Oh ..................... H01L 51/5265 257/59 |
| 2013/0201634 | A1 | 8/2013 | Im et al. |

FOREIGN PATENT DOCUMENTS

KR    10-2013-0082449    7/2013

* cited by examiner

*Primary Examiner* — Victor A Mandala
*Assistant Examiner* — Colleen E Snow
(74) *Attorney, Agent, or Firm* — H.C. Park & Associates, PLC

(57) ABSTRACT

A display device may include a substrate, a first layer on the substrate, the first layer including a first portion having a first thickness and a second portion having a second thickness greater than the first thickness, a second layer on the first layer, an active pattern on the second layer, the active pattern overlapping only the first portion of the first layer, a gate electrode on the active pattern, a source electrode and a drain electrode on the gate electrode and connected to the active pattern, a first electrode connected to one of the source electrode and the drain electrode, a pixel defining layer on the first electrode, the pixel defining layer having an opening portion exposing at least a portion of the first electrode, an emission layer in the opening portion on the first electrode, and a second electrode on the emission layer.

20 Claims, 10 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2018-0136245, filed on Nov. 8, 2018, which is hereby incorporated by reference for all purposes as if fully set forth herein.

BACKGROUND

Field

Exemplary implementations of the invention relate generally to a display device and, more specifically, to a display device including a polycrystalline silicon substrate and a method of manufacturing the display device.

Discussion of the Background

An active matrix (AM) type organic light emitting display device may include a pixel driving circuit in each pixel and the pixel driving circuit may include a thin film transistor (TFT) using silicon. The TFT may be formed of amorphous silicon or polycrystalline silicon.

Since an active layer having a source, a drain, and a channel is formed of amorphous silicon (a-Si), an a-Si TFT used in the pixel driving circuit may have a low electron mobility of 1 $cm^2/Vs$ or less. Therefore, the a-Si TFT has been recently replaced with polycrystalline silicon (poly-Si) TFT. The poly-Si TFT has higher electron mobility and a safer light illumination than the a-Si TFT. Therefore, the poly-Si TFT may be appropriate to be used as an active layer of a driving TFT and/or a switching TFT of the AM type organic light emitting display device.

The poly-Si may be manufactured according to several methods. These methods may be generally classified as either a method of depositing poly-Si or a method of depositing and crystallizing a-Si.

Examples of the method of depositing the poly-Si include chemical vapor deposition (CVD), sputtering, vacuum evaporation, etc.

Examples of the method of depositing and crystallizing the a-Si include solid phase crystallization (SPC), excimer laser crystallization (ELC), metal induced crystallization (MIC), metal induced lateral crystallization (MILC), sequential lateral solidification (SLS), etc.

The above information disclosed in this Background section is only for understanding of the background of the inventive concepts, and, therefore, it may contain information that does not constitute prior art.

SUMMARY

Display devices and methods of manufacturing the same constructed according to the principles and exemplary implementations of the invention are capable of preventing defects such as stains from being generated in high temperature processes, such as Excimer Laser Annealing (ELA), used to make active patterns in—a Si TFT of a display. For example, generation of ELA stains in an active pattern of the display device by hydrogen diffused upwardly from a first buffer layer in laser crystallization process can be prevented by the first buffer layer having a first portion with relatively thin thickness and the active pattern overlapping the first portion of the first buffer layer.

Further, in exemplary methods of manufacturing the display device according to the principles of the invention, after forming the first buffer layer including the first portion having the relatively thin thickness and the amorphous silicon layer, the amorphous silicon layer may be crystallized and patterned to form the polycrystalline silicon pattern overlapping the first portion of the first buffer layer. Accordingly, a display device without ELA stains can be manufactured.

Additional features of the inventive concepts will be set forth in the description which follows, and in part will be apparent from the description, or may be learned by practice of the inventive concepts.

According to one aspect of the invention, a display device includes a substrate, a first layer disposed on the substrate, the first layer including a first portion having a first thickness and a second portion having a second thickness greater than the first thickness, a second layer disposed on the first layer, an active pattern disposed on the second layer, the active pattern overlapping only the first portion of the first layer, a gate electrode disposed on the active pattern, a source electrode and a drain electrode disposed on the gate electrode, the source electrode and the drain electrode being connected to the active pattern, a first electrode connected to one of the source electrode and the drain electrode, a pixel defining layer disposed on the first electrode, the pixel defining layer having an opening portion exposing at least a portion of the first electrode, an emission layer in the opening portion disposed on the first electrode, and a second electrode disposed on the emission layer.

The second layer may include a third portion having a third thickness and a fourth portion having a fourth thickness less than the third thickness.

The third portion of the second layer may overlap the first portion of the first layer, and the fourth portion of the second layer may overlap the second portion of the first layer.

The first thickness may be less than the third thickness.

An upper surface of the second layer may be substantially planarized.

The active pattern may not overlap the second portion of the first layer.

The first layer may include a buffer layer including silicon nitride.

The second layer may include a buffer layer including silicon oxide.

The first layer may have a first hydrogen concentration and the second layer may have a second hydrogen concentration, the first hydrogen concentration being greater than the second hydrogen concentration.

The active pattern may include polycrystalline silicon.

The active pattern may include a source region and a drain region respectively connected to the source electrode and the drain electrode, and a channel region disposed between the source region and the drain region.

The first layer may further include an alignment mark.

According to another aspect of the invention, a method of manufacturing a display device, the method includes the steps of forming on a substrate a first layer including a first portion having a first thickness and a second portion having a second thickness greater than the first thickness, forming a second layer on the first layer, and forming a polycrystalline silicon pattern overlapping the first portion of the first layer on the second layer.

The step of forming the first layer may include the steps of forming on the substrate a first inorganic layer having the second thickness with silicon nitride, and partially etching a portion of the first inorganic layer corresponding to the first portion.

The step of forming the polycrystalline silicon pattern may include the steps of forming a polycrystalline silicon layer on the second layer, and etching a portion of the polycrystalline silicon layer overlapping only the second portion.

The step of forming the polycrystalline silicon layer may include the steps of forming an amorphous silicon layer on the second layer, and crystallizing the amorphous silicon layer.

The step of partially etching the portion of the first inorganic layer corresponding to the first portion may include the steps of forming a first photoresist layer on the first inorganic layer, placing a first photomask on the first photoresist layer such that a first light transmitting portion of the first photomask corresponds to the first portion and a first light blocking portion of the first photomask corresponds to the second portion, exposing and developing the first photoresist layer to form a first photoresist pattern, and partially etching the first inorganic layer using the first photoresist pattern as an etch-stopper.

The step of etching the portion of the polycrystalline silicon layer overlapping the second portion may include the steps of forming a second photoresist layer on the polycrystalline silicon layer, placing a second photomask on the second photoresist layer such that a second light transmitting portion of the second photomask corresponds to the second portion and a second light blocking portion of the second photomask corresponds to the first portion, exposing and developing the second photoresist layer to form a second photoresist pattern, and etching the polycrystalline silicon layer using the second photoresist pattern as an etch-stopper.

The step of forming the first layer may further include the steps of forming an alignment mark, and the second photomask may be aligned with the first layer using the alignment mask.

The step of forming the second layer may include the steps of forming a second inorganic layer with silicon oxide on the first layer, and planarizing an upper surface of the second inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
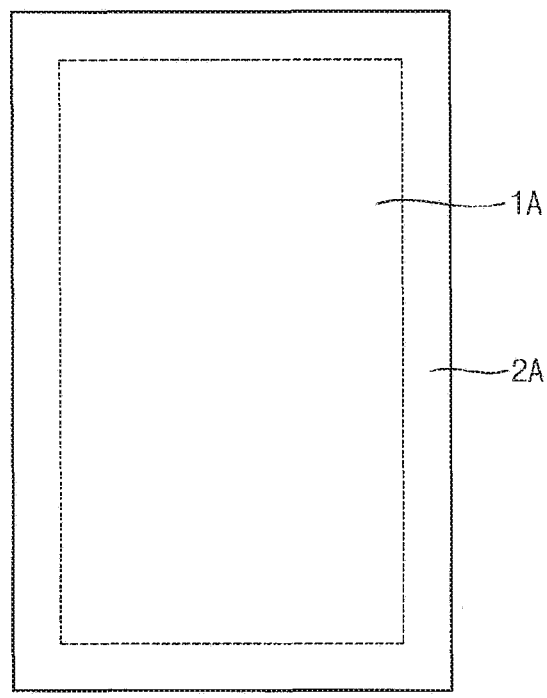
FIG. 1 is a plan view of an exemplary embodiment of a polycrystalline silicon substrate constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, polycrystalline silicon substrates, methods of manufacturing polycrystalline silicon substrates, and display devices in accordance with exemplary embodiments of the invention will be explained in detail with reference to the accompanying drawings.

Hereinafter, a polycrystalline silicon substrate according to an exemplary embodiment will be described with reference to FIGS. 1 to 3.

FIG. 1 is a plan view of an exemplary embodiment of a polycrystalline silicon substrate constructed according to the principles of the invention.

Referring to FIG. 1, a polycrystalline silicon substrate according to an exemplary embodiment may include a first area 1A and a second area 2A adjacent to the first area 1A. For example, the second area 2A may surround the first area 1A. In an exemplary embodiment, the polycrystalline silicon substrate may be a polycrystalline silicon substrate for a display device. For example, the first area 1A and the second area 2A may correspond to a display area and a peripheral area of the display device, respectively.

Figure 2:
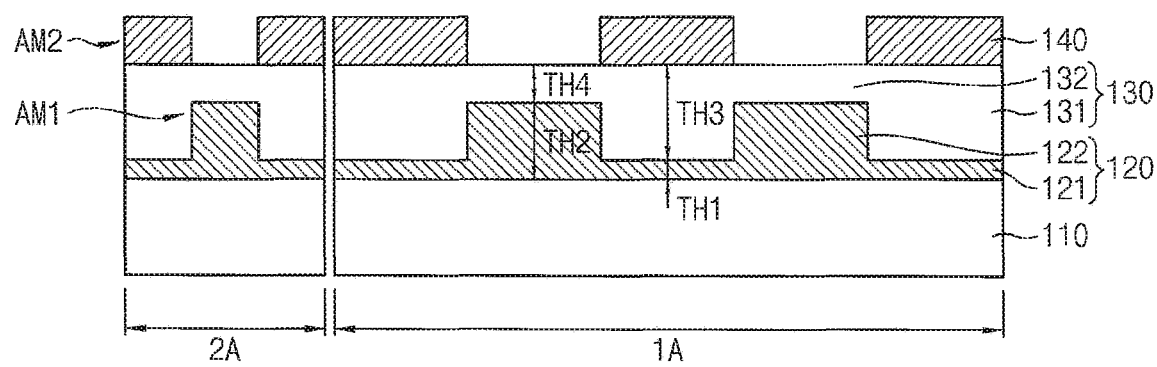
FIG. 2 is a cross-sectional view of an exemplary embodiment of a polycrystalline silicon substrate constructed according to the principles of the invention.

FIG. 2 is a cross-sectional view of an exemplary embodiment of a polycrystalline silicon substrate constructed according to the principles of the invention, Referring to FIG. 2, a polycrystalline silicon substrate according to an exemplary embodiment may include a substrate 110, a buffer layer, and a polycrystalline silicon pattern 140. In an exemplary embodiment, the polycrystalline silicon substrate may further include a first alignment mark AM1 and a second alignment mark AM2.

The substrate 110 may be an insulating substrate including glass, quartz, ceramic, etc. In an exemplary embodiment, the substrate 110 may be an insulating flexible substrate including plastic such as polyethylene terephthalate (PET), polyethylene naphthalate (PEN), polyether ether ketone (PEEK), polycarbonate (PC), polyarylate, polyether sulfone (PES), polyimide (PI), etc.

The buffer layer may be disposed on the substrate 110. The buffer layer may provide a planarized surface above the substrate 110. The buffer layer may prevent impurities from permeating above the substrate 110 through the substrate 110. The buffer layer may include a first buffer layer 120 and a second buffer layer 130.

The first buffer layer 120 may be disposed on the substrate 110. In an exemplary embodiment, the first buffer layer 120 may include silicon nitride ($SiN_x$).

The first buffer layer 120 may have a relatively high hydrogen concentration. The silicon nitride included in the first buffer layer 120 may contain a relatively large amount of hydrogen. For example, the first buffer layer 120 may have a hydrogen concentration from about 16% to about 20%.

The first buffer layer 120 may include a first portion 121 and a second portion 122. The first portion 121 and the second portion 122 may have different thicknesses from each other. The first portion 121 may have a first thickness TH1, and the second portion 122 may have a second thickness TH2 greater than the first thickness TH1. For example, the first thickness TH1 may be in a range from about 50 Å to about 200 Å, and the second thickness TH2 may be about 500 Å. Therefore, the first buffer layer 120 may have a concavo-convex shape in which the second portion 122 protrudes upward from the first portion 121.

The first buffer layer 120 may further include the first alignment mark AM1. The first alignment mark AM1 may be formed in the second area 2A. The first alignment mark AM1 may serve to align the polycrystalline silicon pattern 140 to the first buffer layer 120.

The second buffer layer 130 may be disposed on the first buffer layer 120. In an exemplary embodiment, the second buffer layer 130 may include silicon oxide ($SiO_x$).

The second buffer layer 130 may have a relatively low hydrogen concentration. The silicon oxide included in the second buffer layer 130 may contain a relatively small amount of hydrogen. Therefore, a hydrogen concentration of the first buffer layer 120 may be greater than a hydrogen concentration of the second buffer layer 130.

The second buffer layer 130 may include a third portion 131 and a fourth portion 132. The third portion 131 and the fourth portion 132 may have different thicknesses from each other. The third portion 131 may have a third thickness TH3, and the fourth portion 132 may have a fourth thickness TH4 less than the third thickness TH3. For example, the third thickness TH3 may be about 3000 Å, and the fourth thickness TH4 may be in a range from about 2550 Å to about 2700 Å.

The third portion 131 of the second buffer layer 130 may overlap the first portion 121 of the first buffer layer 120, and the fourth portion 132 of the second buffer layer 130 may overlap the second portion 122 of the first buffer layer 120. In an exemplary embodiment, the first thickness TH1 of the first portion 121 may be less than the third thickness TH3 of the third portion 131.

In an exemplary embodiment, an upper surface of the second buffer layer 130 may be substantially planarized. When an upper surface of the substrate 110 is planarized, an addition of the first thickness TH1 and the third thickness TH3 may be substantially equal to an addition of the second thickness TH2 and the fourth thickness TH4. Therefore, the second buffer layer 130 may have a concavo-convex shape in which the third portion 131 protrudes downward from the fourth portion 132.

The polycrystalline silicon pattern 140 may be disposed on the second buffer layer 130. The polycrystalline silicon pattern 140 may include polycrystalline silicon.

The polycrystalline silicon pattern 140 may overlap the first portion 121 of the first buffer layer 120. The polycrystalline silicon pattern 140 may not overlap the second portion 122 of the first buffer layer 120. Since the third portion 131 and the fourth portion 132 of the second buffer layer 130 overlap the first portion 121 and the second portion 122 of the first buffer layer 120, respectively, the polycrystalline silicon pattern 140 may overlap the third portion 131 of the second buffer layer 130, and may not overlap the fourth portion 132 of the second buffer layer 130.

Figure 3:
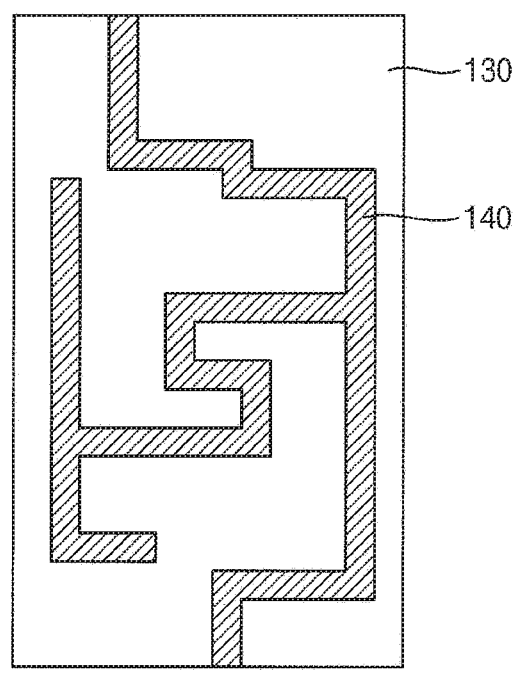
FIG. 3 is a plan view of the polycrystalline silicon pattern of the polycrystalline silicon substrate in FIG. 2.

FIG. 3 is a plan view of the polycrystalline silicon pattern 140 of the polycrystalline silicon substrate in FIG. 2.

Referring to FIG. 3, the polycrystalline silicon pattern 140 may have a curved and elongated shape in a plan view. Since the polycrystalline silicon pattern 140 overlaps the first portion 121 of the first buffer layer 120, the first portion 121 may have a curved and elongated shape in a plan view substantially the same as that of the polycrystalline silicon pattern 140. Moreover, since the third portion 131 of the second buffer layer 130 overlaps the first portion 121 of the first buffer layer 120, the third portion 131 may have a curved and elongated shape in a plan view substantially the same as that of the polycrystalline silicon pattern 140.

Referring to FIG. 2 again, the second alignment mark AM2 may be formed in a process of forming the polycrystalline silicon pattern 140. For example, the second alignment mark AM2 may be formed in the second area 2A by etching the polycrystalline silicon layer. Accordingly, the second alignment mark AM2 may be formed in the second area 2A. The second alignment mark AM2 may be formed to overlap the first alignment mark AM1. Therefore, whether the polycrystalline silicon pattern 140 and the first buffer layer 120 are aligned may be determined by checking whether the first alignment mark AM1 and the second alignment mark AM2 overlap each other.

Hereinafter, a method of manufacturing a polycrystalline silicon substrate according to an exemplary embodiment will be described with reference to FIGS. 4 to 12.

Figure 4:
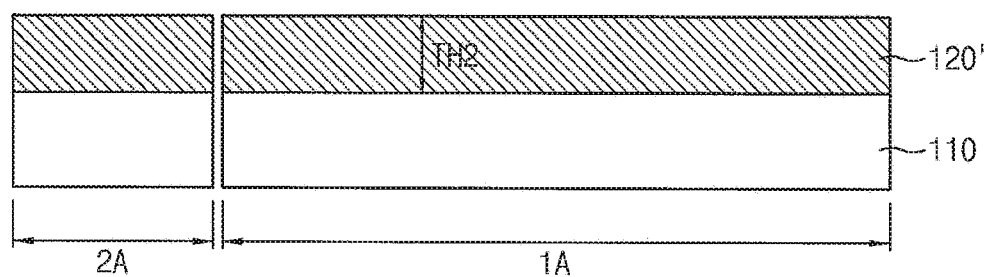
FIGS. 4, 5, 6A, 7, 8A, 9, 10, 11, and 12 are cross-sectional views
Figure 5:
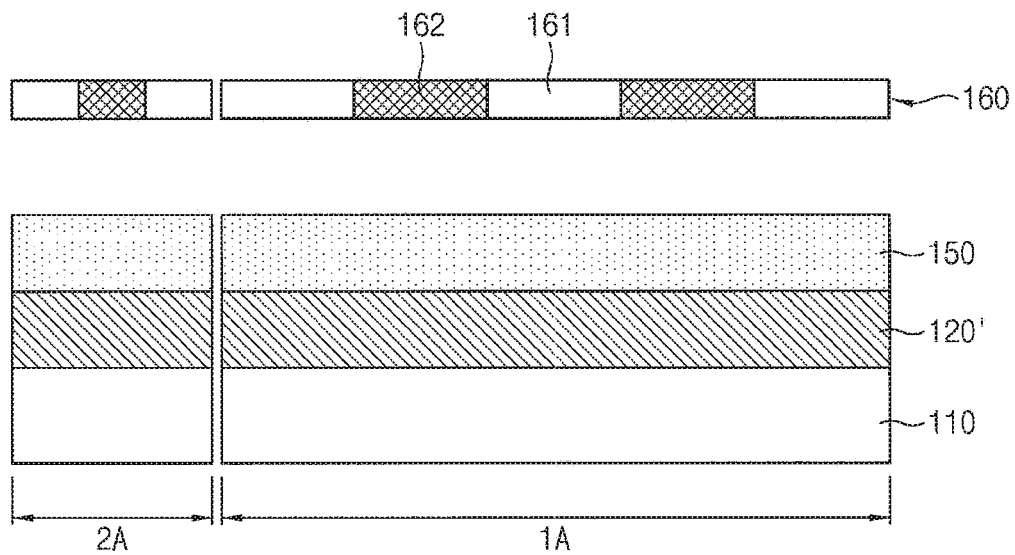
Figure 6A:
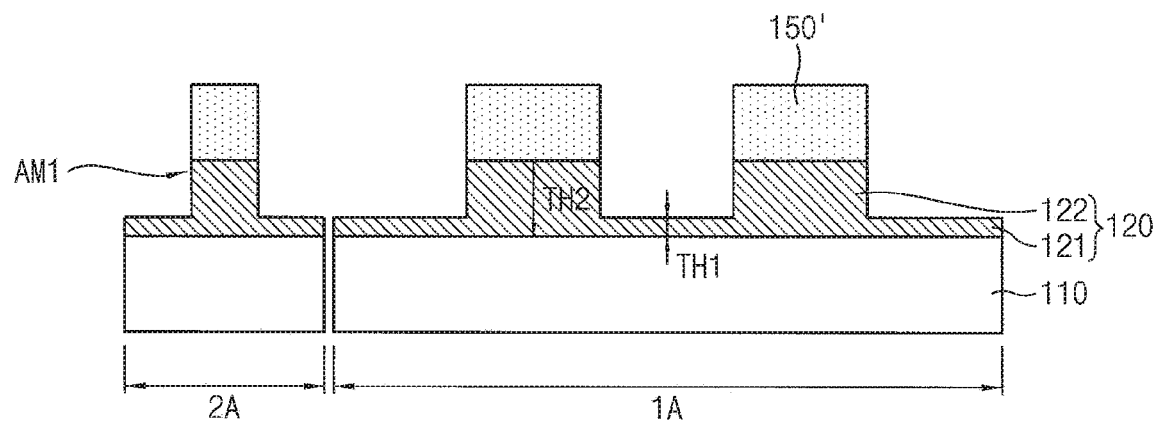
Figure 6B:
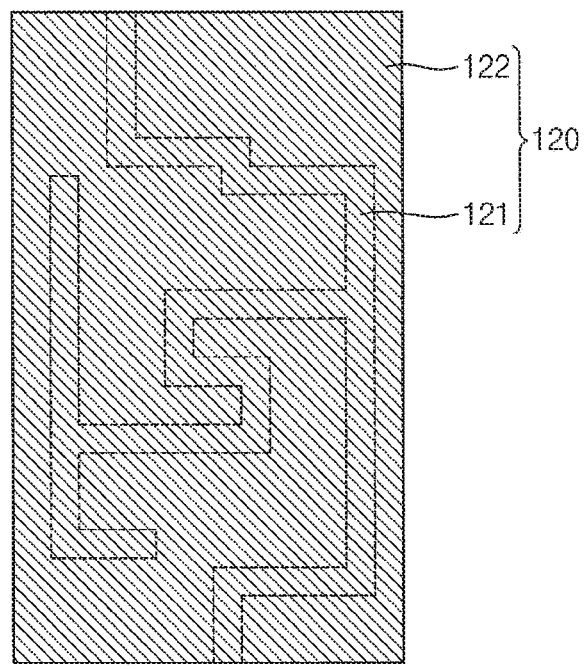
FIGS. 6B and 8B are plan views illustrating a method of manufacturing a polycrystalline silicon substrate according to an exemplary embodiment.
Figure 7:
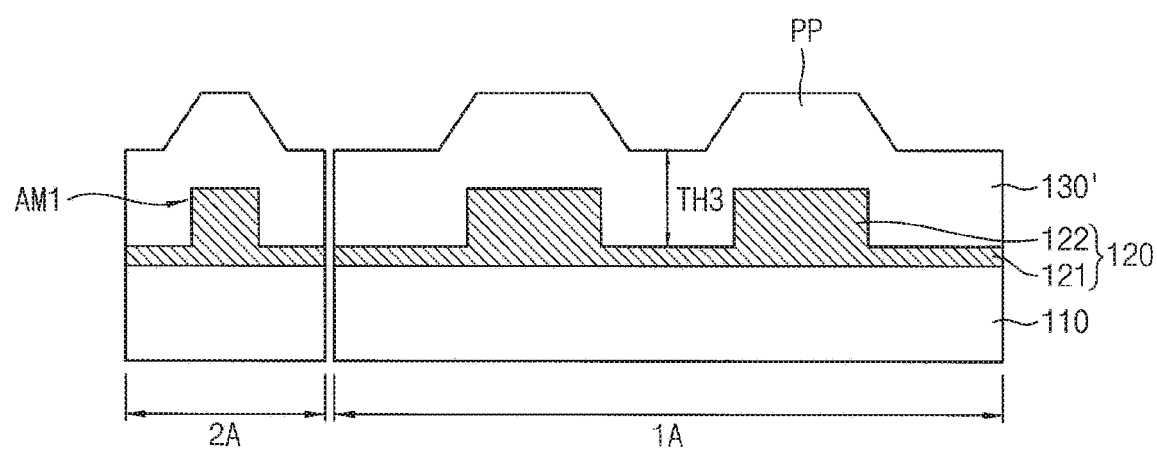
Figure 8A:
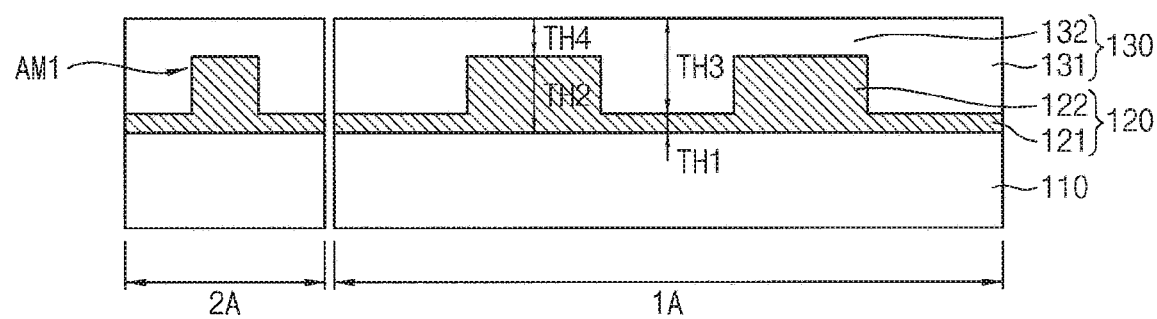
Figure 8B:
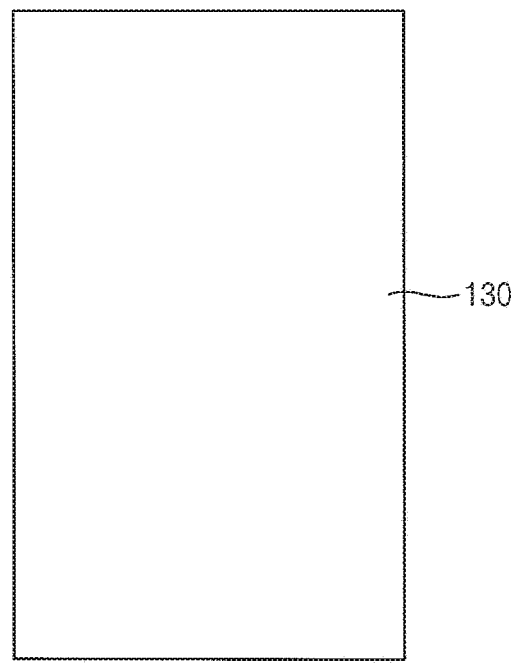

FIGS. 4, 5, 6A, 7, 8A, 9, 10, 11, and 12 are cross-sectional views and FIGS. 6B and 8B are plan views illustrating a method of manufacturing a polycrystalline silicon substrate according to an exemplary embodiment.

Referring to FIG. 4, a first inorganic layer 120' may be formed on the substrate 110. The first inorganic layer 120' may be formed with the second thickness TH2. For example, the second thickness may be about 500 Å. The first inorganic layer 120' may be formed of silicon nitride. For example, the first inorganic layer 120' may be formed by methods such as low pressure chemical vapor deposition (LPCVD), atmospheric pressure chemical vapor deposition (APCVD), plasma enhanced chemical vapor deposition (PECVD), sputtering, vacuum evaporation, etc.

Referring to FIGS. 5, 6A, and 6B, the first inorganic layer 120' may be partially etched to form the first buffer layer 120 including the first portion 121 and the second portion 122. The first portion 121 may have the first thickness TH1, and the second portion 122 may have the second thickness TH2 greater than the first thickness TH1. Therefore, the first buffer layer 120 may have a concavo-convex shape in which the second portion 122 protrudes upward from the first portion 121.

First, a first photoresist layer 150 may be formed on the first inorganic layer 120'. In an exemplary embodiment, the first photoresist layer 150 may include a positive photoresist. Therefore, an exposed portion of the first photoresist layer 150 may be removed, and an unexposed portion of the first photoresist layer 150 may remain.

Then, a first photomask 160 may be placed on the first photoresist layer 150. The first photomask 160 may include a first light transmitting portion 161 and a first light blocking portion 162. The first light transmitting portion 161 may transmit light, and the first light blocking portion 162 may block light. For example, a light transmittance of the first light transmitting portion 161 may be about 100%, and a light transmittance of the first light blocking portion 162 may be about 0%. The first photomask 160 may be placed such that the first light transmitting portion 161 corresponds to the first portion 121 and the first light blocking portion 162 corresponds to the second portion 122. The first light transmitting portion 161 may have a curved and elongated shape in a plan view.

Then, the first photoresist layer 150 may be exposed and developed using the first photomask 160. A portion of the first photoresist layer 150 exposed by the first light transmitting portion 161 may be removed, and another portion of the first photoresist layer 150 unexposed by the first light blocking portion 162 may remain, therefore, a first photoresist pattern 150' may be formed.

Then, the first inorganic layer 120' may be partially etched using the first photoresist pattern 150' as an etch-stopper. For example, the first inorganic layer 120' may be etched by a dry etching.

A first portion of the first inorganic layer 120' uncovered by the first photoresist pattern 150' may be partially etched, and may remain with the first thickness TH1. In other words, the first portion of the first inorganic layer 120' may be etched by the second thickness TH2 minus the first thickness TH1. For example, the first thickness TH1 may be in a range from about 50 Å to about 200 Å. In an exemplary embodiment, the first portion of the first inorganic layer 120' may be partially etched by controlling an etching time. For example, when an etching time for entirely etching the first inorganic layer 120' is 100, the first portion of the first inorganic layer 120' may be partially etched by adjusting the etching time to a value greater than 0 and less than 100. The partially-etched first portion of the first inorganic layer 120' may correspond to the first portion 121 of the first buffer layer 120. The first portion 121 of the first buffer layer 120 may have a curved and elongated shape in a plan view.

A second portion of the first inorganic layer 120' covered by the first photoresist pattern 150' may not be etched, and may remain with the second thickness TH2. The non-etched second portion of the first inorganic layer 120' may correspond to the second portion 122 of the first buffer layer 120.

The first alignment mark AM1 may be formed in a process of forming the first buffer layer 120. The first alignment mark AM1 may be formed in the second area 2A by partially etching the first inorganic layer 120'. The first alignment mark AM1 may serve to align the polycrystalline silicon pattern 140 to the first buffer layer 120 in a subsequent process.

Referring to FIG. 7, a second inorganic layer 130' may be formed on the first buffer layer 120. The second inorganic layer 130' may be formed with the third thickness TH3. For example, the third thickness TH3 may be about 3000 Å. The second inorganic layer 130' may be formed along a profile of the first buffer layer 120. For example, a portion of the second inorganic layer 130' formed on the relatively thick second portion 122 may protrude upward relative to another portion of the second inorganic layer 130' formed on the relatively thin first portion 121. Accordingly, the second inorganic layer 130' may include a protruding portion PP formed on the second portion 122 of the first buffer layer 120.

The second inorganic layer 130' may be formed of silicon oxide. For example, the second inorganic layer 130' may be formed by methods such as LPCVD, APCVD, PECVD, sputtering, vacuum evaporation, etc.

Referring to FIGS. 8A and 8B, an upper surface of the second inorganic layer 130' may be planarized to form the second buffer layer 130 including the third portion 131 and the fourth portion 132. The second buffer layer 130 may have a substantially planarized upper surface. The third portion 131 may have the third thickness TH3, and the fourth portion 132 may have the fourth thickness TH4 less than the third thickness TH3. Therefore, the second buffer layer 130 may have a concavo-convex shape in which the third portion 131 protrudes downward from the fourth portion 132.

The protruding portion PP of the second inorganic layer 130' may be polished to planarize the upper surface of the second inorganic layer 130'. In an exemplary embodiment, the upper surface of the second inorganic layer 130' may be planarized by chemical mechanical polishing. For example, a first portion of the second inorganic layer 130' formed on the relatively thick second portion 122 may be polished by the third thickness TH3 minus the fourth thickness TH4, and a second portion of the second inorganic layer 130' formed on the relatively thin first portion 121 may not be polished. The unpolished second portion of the second inorganic layer 130' may correspond to the third portion 131 of the second buffer layer 131, and the polished first portion of the second inorganic layer 130' may correspond to the fourth portion 132 of the second buffer layer 130.

Figure 9:
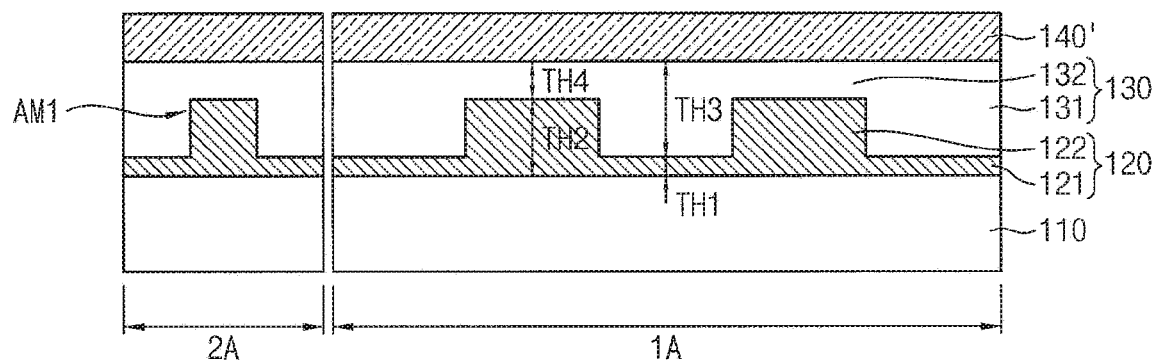

Referring to FIG. 9, an amorphous silicon layer 140' may be formed on the second buffer layer 130. The amorphous silicon layer 140' may be formed of amorphous silicon. For example, the amorphous silicon layer 140' may be formed by methods such as LPCVD, APCVD, PECVD, sputtering, vacuum evaporation, etc.

When an upper portion of the amorphous silicon layer 140' is exposed to air, a natural oxide layer may be formed on the amorphous silicon layer 140'. When the natural oxide layer remains on the amorphous silicon layer 140', a surface roughness of a polycrystalline silicon layer may increase by the natural oxide layer in a subsequent process for crystallizing the amorphous silicon layer 140' to form the polycrystalline silicon layer. Accordingly, the amorphous silicon layer 140' may be cleaned using ozone ($O_3$), hydrofluoric acid, etc. to remove the natural oxide layer. In addition, the amorphous silicon layer 140' may be rinsed using deionized water (DW) after cleaning.

Figure 10:
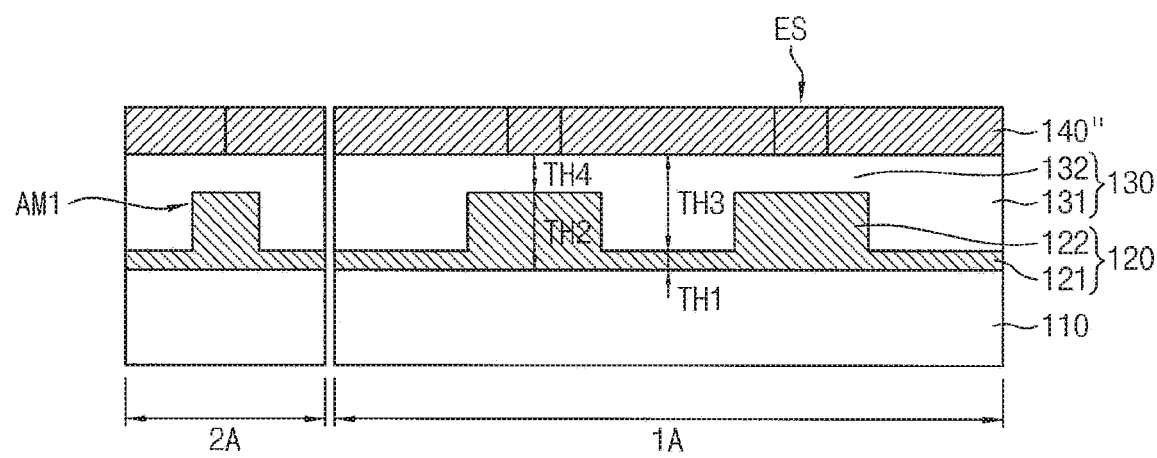

Referring to FIG. 10, the amorphous silicon layer 140' may be crystallized to form a polycrystalline silicon layer 140".

In an exemplary embodiment, the amorphous silicon layer 140' may be crystallized by excimer laser annealing (ELA). The polycrystalline silicon layer 140" may be formed by irradiating the amorphous silicon layer 140' with a laser beam. A laser may intermittently generate the laser beam to irradiate the amorphous silicon layer 140'. For example, the laser may be an excimer laser for generating a laser beam with a relatively short wavelength, at relatively high power, and relatively high efficiency. The excimer laser may include, for example, an inert gas, an inert gas halide, a mercury halide, an inert gas acid compound, and a polyatomic excimer. Examples of the inert gas are $Ar_2$, $Kr_2$, and $Xe_2$. Examples of the inert gas halide are ArF, ArCl, KrF, KrCl, XeF, and XeCl. Examples of the mercury halide are HgCl, HgBr, and HgI. Examples of the inert gas acid compound are ArO, KrO, and XeO. Examples of the polyatomic excimer are $Kr_2F$, and $Xe_2F$.

When energy of the laser beam irradiated on the amorphous silicon layer 140' in a process of forming the polycrystalline silicon layer 140" is relatively large, the laser beam may affect the buffer layer located under the amorphous silicon layer 140'. For example, hydrogen included in the buffer layer may be diffused into the polycrystalline silicon layer 140" in the process of forming the polycrystalline silicon layer 140", and ELA stains ES having a stripe shape may be formed at the polycrystalline silicon layer 140" according to the hydrogen. Specifically, hydrogen emitted from the first buffer layer 120 having a relatively high hydrogen concentration may be diffused upward thereby forming the ELA stains ES at the polycrystalline silicon layer 140". The second buffer layer 130 having a relatively low hydrogen concentration may serve to prevent hydrogen emitted from the first buffer layer 120 from flowing into the polycrystalline silicon layer 140".

Therefore, the ELA stains ES may not be substantially formed at a portion of the polycrystalline silicon layer 140" disposed on the relatively thin first portion 121 of the first buffer layer 120 and the relatively thick third portion 131 of the second buffer layer 130. The ELA stains ES may be formed at another portion of the polycrystalline silicon layer 140" disposed on the relatively thick second portion 122 of the first buffer layer 120 and the relatively thin fourth portion 132 of the second buffer layer 130.

Figure 11:
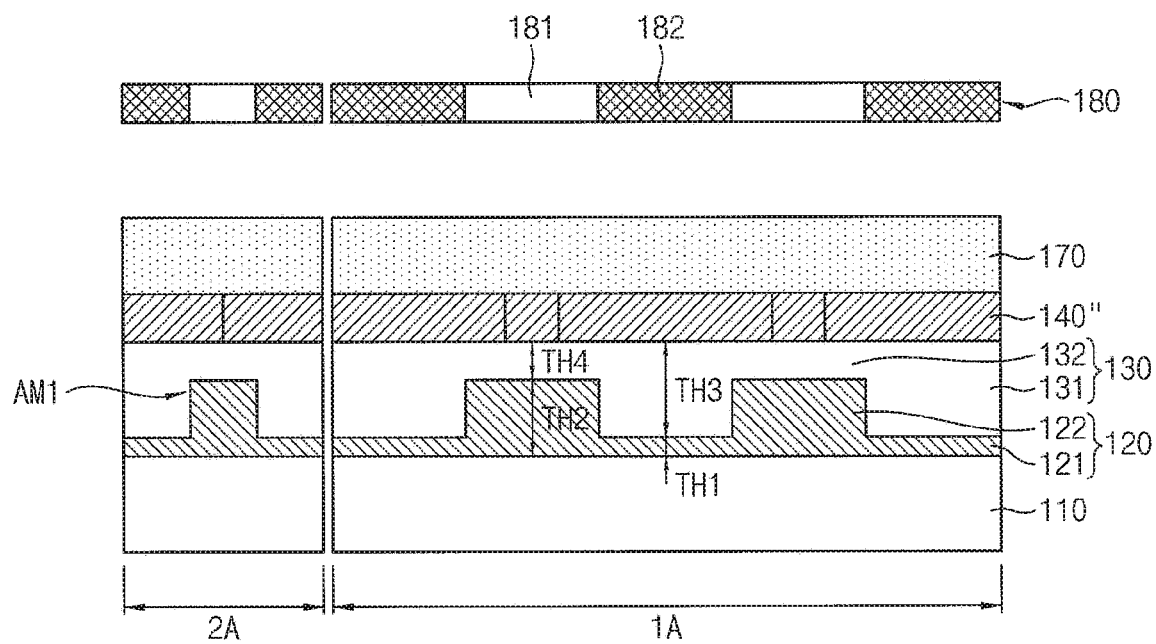
Figure 12:
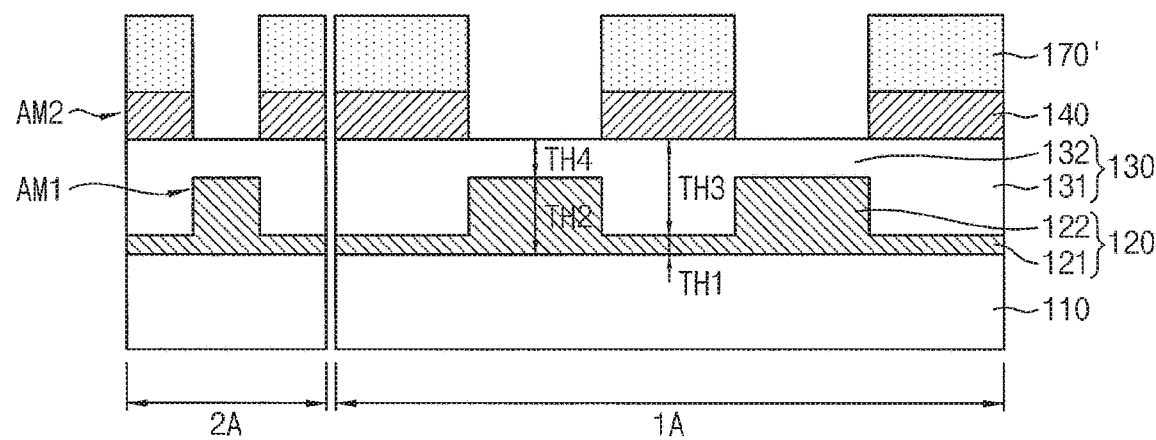

Referring to FIGS. 11 and 12, the polycrystalline silicon layer 140" may be etched to form the polycrystalline silicon pattern 140. The polycrystalline silicon pattern 140 may overlap the first portion 121 of the first buffer layer 120. The polycrystalline silicon pattern 140 may not overlap the second portion 122 of the first buffer layer 120.

First, a second photoresist layer 170 may be formed on the polycrystalline silicon layer 140". In an exemplary embodiment, the second photoresist layer 170 may include a positive photoresist. Therefore, an exposed portion of the second photoresist layer 170 may be removed, and an unexposed portion of the second photoresist layer 170 may remain.

Then, a second photomask 180 may be placed on the second photoresist layer 170. The second photomask 180 may include a second light transmitting portion 181 and a second light blocking portion 182. The second light transmitting portion 181 may transmit light, and the second light blocking portion 182 may block light. For example, a light transmittance of the second light transmitting portion 181 may be about 100%, and a light transmittance of the second light blocking portion 182 may be about 0%. The second photomask 180 may be placed such that the second light transmitting portion 181 corresponds to the second portion 122 of the first buffer layer 120 and the second light blocking portion 182 corresponds to the first portion 121 of the first buffer layer 120. The second light blocking portion 182 may have a curved and elongated shape in a plan view.

In an exemplary embodiment, the second photomask 180 may be aligned with the first buffer layer 120 using the first alignment mark AM1. An alignment mark of the second photomask 180 may be aligned with the first alignment mark AM1 formed in the first buffer layer 120, so that the second light transmitting portion 181 of the second photomask 180 may be aligned with the second portion 122 of the first buffer layer 120 and the second light blocking portion 182 of the second photomask 180 may be aligned with the first portion 121 of the first buffer layer 120.

Then, the second photoresist layer 170 may be exposed and developed using the second photomask 180. A portion of the second photoresist layer 170 exposed by the second light transmitting portion 181 may be removed, and another portion of the second photoresist layer 170 unexposed by the second light blocking portion 182 may remain, therefore, a second photoresist pattern 170' may be formed.

Then, the polycrystalline silicon layer 140" may be etched using the second photoresist pattern 170' as an etch-stopper. For example, the polycrystalline silicon layer 140" may be etched by a dry etching.

A first portion of the polycrystalline silicon layer 140" uncovered by the second photoresist pattern 170' may be substantially etched and removed. A second portion of the polycrystalline silicon layer 140" covered by the second photoresist pattern 170' may not be etched and remain. The non-etched second portion of the polycrystalline silicon layer 140" may correspond to the polycrystalline silicon pattern 140. The polycrystalline silicon pattern 140 may have a curved and elongated shape in a plan view as shown in FIG. 3.

The second alignment mark AM2 may be formed in a process of forming the polycrystalline silicon pattern 140. The second alignment mark AM2 may be formed in the second area 2A by etching the polycrystalline silicon layer 140". The second alignment mark AM2 may be formed to overlap the first alignment mark AM1. Therefore, whether the polycrystalline silicon pattern 140 and the first buffer layer 120 are aligned may be determined by checking whether the first alignment mark AM1 and the second alignment mark AM2 overlap each other. The second alignment mark AM2 may serve to align other layers to the polycrystalline silicon pattern 140 in a subsequent process.

The ELA stains ES may not be substantially formed at a first portion of the polycrystalline silicon layer 140" disposed on the relatively thin first portion 121 of the first buffer layer 120 and the relatively thick third portion 131 of the second buffer layer 130. Since the first portion of the polycrystalline silicon layer 140" corresponds to the polycrystalline silicon pattern 140, the polycrystalline silicon substrate according to the illustrated embodiment may include the polycrystalline silicon pattern 140 without the ELA stains ES. The ELA stains ES may be formed at a second portion of the polycrystalline silicon layer 140" disposed on the relatively thick second portion 122 of the first buffer layer 120 and the relatively thin fourth portion 132 of the second buffer layer 130. However, the second portion of the polycrystalline silicon layer 140" may be removed in the process of etching the polycrystalline silicon layer 140".

Hereinafter, a method of manufacturing a polycrystalline silicon substrate according to an exemplary embodiment will be described with reference to FIGS. 4 to 10, 13, and 14.

Descriptions of elements of a method of manufacturing a polycrystalline silicon substrate described with reference to FIGS. 4 to 10, 13, and 14, which are substantially the same as or similar to those of the method of manufacturing a polycrystalline silicon substrate described with reference to FIGS. 4 to 12, will not be repeated to avoid redundancy.

Figure 13:
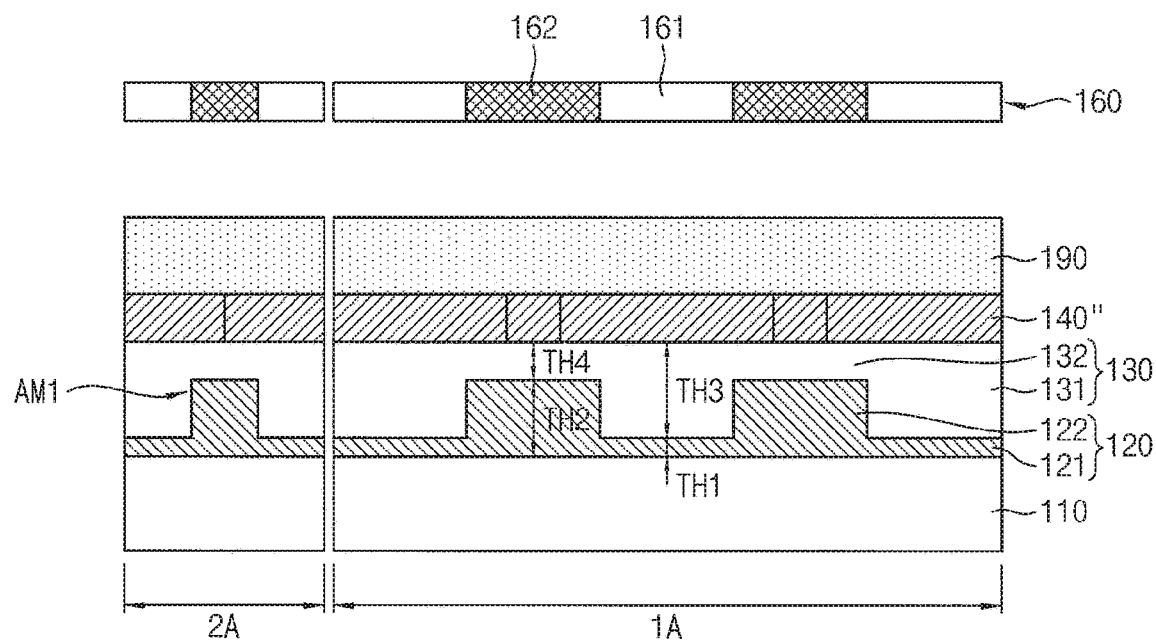
FIGS. 13 and 14 are cross-sectional views illustrating a method of manufacturing a polycrystalline silicon substrate according to another exemplary embodiment.
Figure 14:
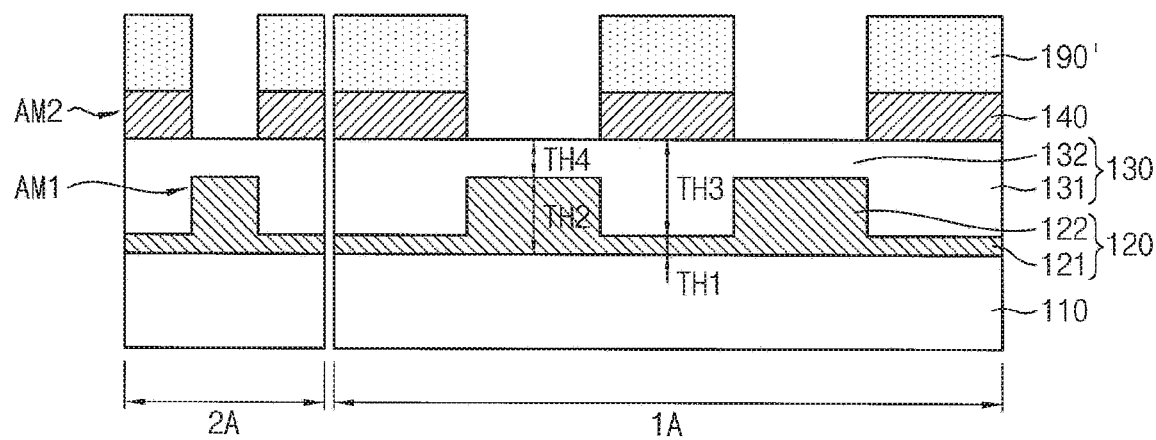

FIGS. 13 and 14 are cross-sectional views illustrating a method of manufacturing a polycrystalline silicon substrate according to another exemplary embodiment.

Referring to FIGS. 13 and 14, the polycrystalline silicon layer 140" may be etched to form the polycrystalline silicon pattern 140. The polycrystalline silicon pattern 140 may overlap the first portion 121 of the first buffer layer 120. The polycrystalline silicon pattern 140 may not overlap the second portion 122 of the first buffer layer 120.

First, a third photoresist layer 190 may be formed on the polycrystalline silicon layer 140". In an exemplary embodiment, the third photoresist layer 190 may include a negative photoresist. Therefore, an exposed portion of the third photoresist layer 190 may remain, and an unexposed portion of the third photoresist layer 190 may be removed.

Then, the first photomask 160 used in the process of forming the first buffer layer 120 may be placed on the third photoresist layer 190. The first photomask 160 may include the first light transmitting portion 161 and the first light blocking portion 162. The first photomask 160 may be placed such that the first light transmitting portion 161 corresponds to the first portion 121 of the first buffer layer 120 and the first light blocking portion 162 corresponds to the second portion 122 of the first buffer layer 120.

In an exemplary embodiment, the first photomask 160 may be aligned with the first buffer layer 120 using the first alignment mark AM1. An alignment mark of the first photomask 160 may be aligned with the first alignment mark AM1 formed in the first buffer layer 120, so that the first light transmitting portion 161 of the first photomask 160 may be aligned with the first portion 121 of the first buffer layer 120 and the first light blocking portion 162 of the first photomask 160 may be aligned with the second portion 122 of the first buffer layer 120.

Then, the third photoresist layer 190 may be exposed and developed using the first photomask 160. A portion of the third photoresist layer 190 exposed by the first light transmitting portion 161 may remain, and another portion of the third photoresist layer 190 unexposed by the first light blocking portion 162 may be removed, therefore, a third photoresist pattern 190' may be formed.

Then, the polycrystalline silicon layer 140" may be etched using the third photoresist pattern 190' as an etch-stopper. For example, the polycrystalline silicon layer 140" may be etched by a dry etching.

A first portion of the polycrystalline silicon layer 140" covered by the third photoresist pattern 190' may not be etched and remain. A second portion of the polycrystalline silicon layer 140" uncovered by the third photoresist pattern 190' may be substantially etched and removed. The non-etched first portion of the polycrystalline silicon layer 140" may correspond to the polycrystalline silicon pattern 140.

Hereinafter, a display device according to an exemplary embodiment will be described with reference to FIGS. 15 to 17.

Figure 15:
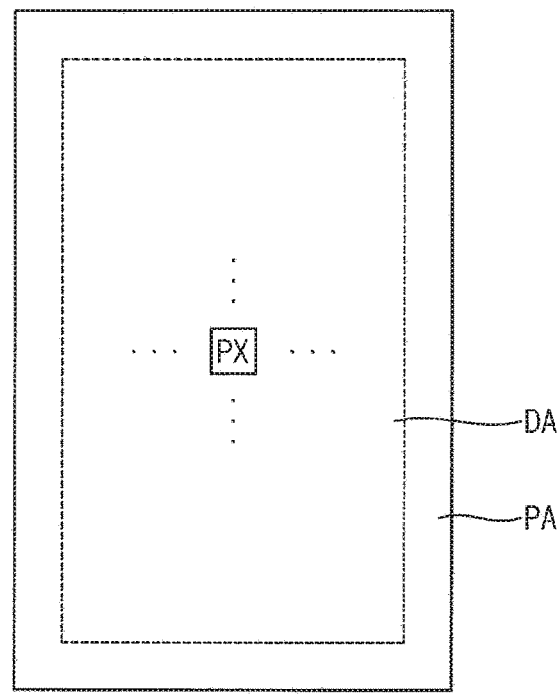
FIG. 15 is a plan view of an exemplary embodiment of a display device constructed according to the principles of the invention.

FIG. 15 is a plan view of an exemplary embodiment of a display device constructed according to the principles of the invention.

Referring to FIG. 15, a display device according to an exemplary embodiment may include a display area DA and a peripheral area PA adjacent to the display area DA. For example, the peripheral area PA may surround the display area DA. The display device illustrated in FIG. 15 may include the polycrystalline silicon substrate illustrated in FIG. 1. For example, the display area DA and the peripheral area PA may correspond to the first area 1A and the second area 2A of the polycrystalline silicon substrate, respectively.

The display area DA may include a plurality of pixels PX. The display area DA may display an image formed by combining light each emitted from the pixels PX. The peripheral area PA may be a non-display area including drivers for transmitting driving signals to the pixels PX.

Figure 16:
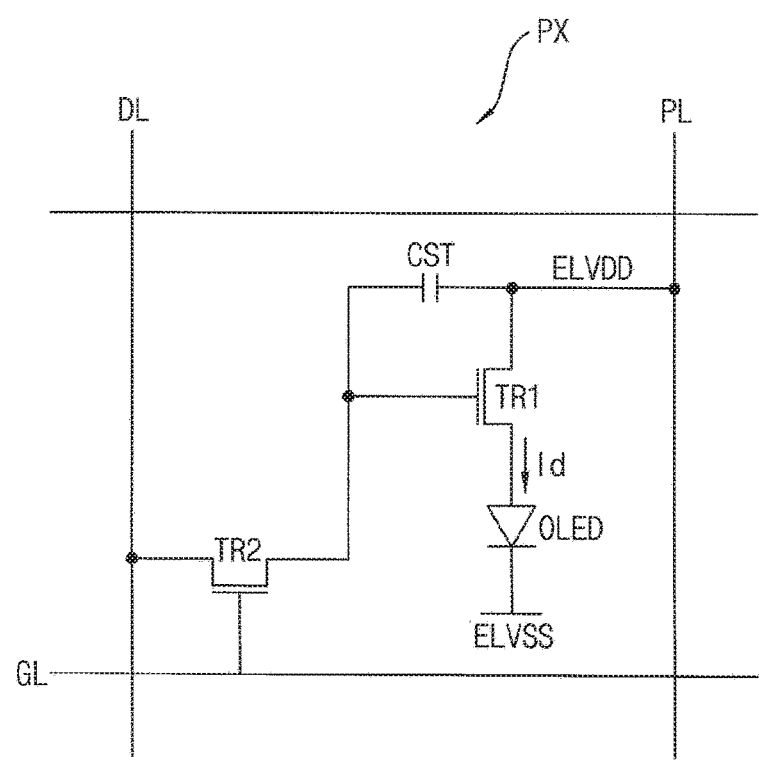
FIG. 16 is an equivalent circuit diagram illustrating one representative pixel of the display device in FIG. 15.

FIG. 16 is an equivalent circuit diagram illustrating one representative pixel PX of the display device in FIG. 15.

Referring to FIG. 16, the display device according to an exemplary embodiment may include signal lines and the pixels PX connected to the signal lines and arranged as a substantial matrix shape.

The signal lines may include gate lines GL for transmitting gate signals (or scan signals), data lines DL for transmitting data voltages, and driving voltage lines PL for transmitting driving voltages ELVDD. The gate lines GL may extend along a substantial row direction. The data lines DL and the driving voltage lines PL may cross the gate lines GL, and may extend along a substantial column direction. Each pixel PX may include a driving transistor TR1, a switching transistor TR2, a storage capacitor CST, and an organic light emitting diode OLED.

The driving transistor TR1 may include a control terminal connected to the switching transistor TR2, an input terminal connected to the driving voltage line PL, and an output terminal connected to the organic light emitting diode OLED. The driving transistor TR1 may transmit an output current Id of which magnitude vary depending on a voltage between the control terminal and the output terminal of the driving transistor TR1 to the organic light emitting diode OLED.

The switching transistor TR2 may include a control terminal connected to the gate line GL, an input terminal connected to the data line DL, and an output terminal connected to the driving transistor TR1. The switching transistor TR2 may transmit the data voltage applied to the data line DL in response to the gate signal applied to the gate line GL to the driving transistor TR1.

The storage capacitor CST may connect the control terminal and the input terminal of the driving transistor TR1. The storage capacitor CST may store the data voltage applied to the control terminal of the driving transistor TR1, and may maintain the data voltage after the switching transistor TR2 is turned off.

The organic light emitting diode OLED may include an anode connected to the output terminal of the driving transistor TR1 and a cathode connected to a common voltage ELVSS. The organic light emitting diode OLED may emit light having different luminance depending on the output current Id of the driving transistor TR1 thereby displaying an image.

In an exemplary embodiment, each pixel PX may include two thin film transistors TR1 and TR2 and one capacitor CST, however, the exemplary embodiments are not limited thereto. For example, in another exemplary embodiment, each pixel PX may include three or more thin film transistors and two or more capacitors.

Figure 17:
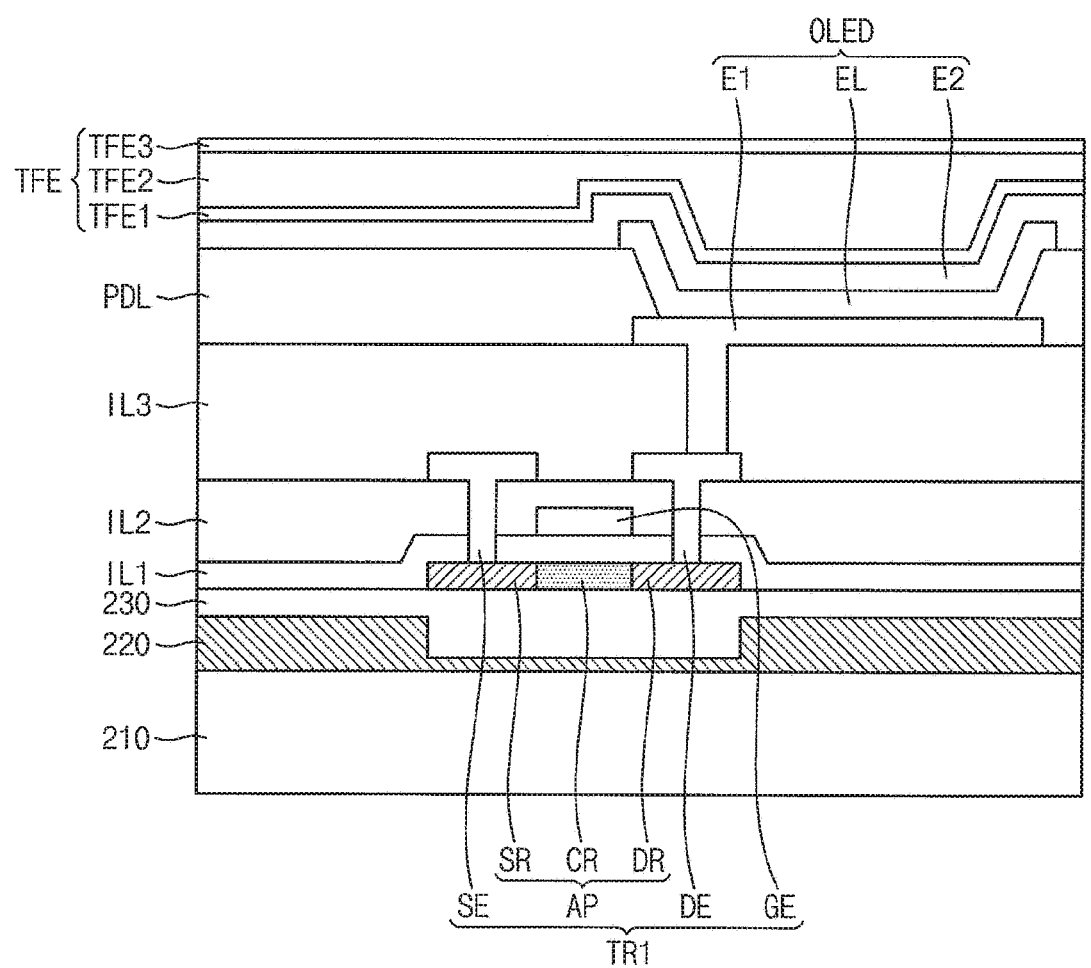
FIG. 17 is a cross-sectional view of an exemplary embodiment of a display device constructed according to the principles of the invention.

FIG. 17 is a cross-sectional view of an exemplary embodiment of a display device constructed according to the principles of the invention.

Referring to FIG. 17, a display device according to an exemplary embodiment may include a substrate 210, a buffer layer disposed on the substrate 210, a thin film transistor TR1 disposed on the buffer layer, and a display element disposed on the thin film transistor TR1. In an exemplary embodiment, the display device may include an organic light emitting diode OLED as the display element. However, the exemplary embodiments are not limited thereto. For example, other exemplary embodiments, the display device may include a liquid crystal element, an electrophoresis element, electrowetting element, etc.

The thin film transistor TR1 and the organic light emitting diode OLED illustrated in FIG. 17 may correspond to the driving transistor TR1 and the organic light emitting diode OLED illustrated in FIG. 16, respectively. The display device according to the illustrated embodiment may include the polycrystalline silicon substrate according to the exemplary embodiment illustrated in FIG. 2.

The buffer layer may include a first buffer layer 220 including silicon nitride and a second buffer layer 230 formed on the first buffer layer 220 and including silicon oxide. The first buffer layer 220 may include a first portion having a first thickness and a second portion having a second thickness greater than the first thickness. The second buffer layer 230 may include a third portion having a third thickness and overlapping the first portion, and a fourth portion having a fourth thickness less than the third thickness and overlapping the second portion. An upper surface of the second buffer layer 230 may be substantially planarized.

The thin film transistor TR1 may be formed on the buffer layer. The thin film transistor TR1 may include an active pattern AP, a gate insulation layer IL1, a gate electrode GE, an insulation interlayer IL2, a source electrode SE, and a drain electrode DE, which are sequentially stacked. The thin film transistor TR1 may perform a switching operation of flowing current through the active pattern AP based on a signal applied to the gate electrode GE.

The active pattern AP may be formed on the second buffer layer 230. The active pattern AP may overlap the first portion of the first buffer layer 220, and may not overlap the second portion of the first buffer layer 220.

The active pattern AP may be formed by injecting ions into portions of the polycrystalline silicon pattern 140 in FIG. 2. Since the polycrystalline silicon pattern 140 is partially doped via an ion injecting process, the active pattern AP including a source region SR, a channel region CR, and a drain region DR may be formed. The ions may be n-type impurities or p-type impurities.

In an exemplary embodiment, impurities with a concentration lower than that of the ion injecting process may be doped into the polycrystalline silicon pattern 140 to form a low concentration doping regions between the channel region CR and the source region SR, and between the channel region CR and the drain region DR. The low concentration doping regions may serve as buffers in the active pattern AP, so that electrical characteristics of the thin film transistor TR1 may be improved.

The gate insulation layer IL1 may be formed on the active pattern AP. The gate insulation layer IL1 may be disposed on the buffer layer with covering the active pattern AP. The gate insulation layer IL1 may insulate the gate electrode GE from the active pattern AP. For example, the gate insulation layer IL1 may be formed of silicon oxide, silicon nitride, etc.

The gate electrode GE may be formed on the gate insulation layer IL1. The gate electrode GE may overlap the active pattern AP. The gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), or an alloy thereof, and may have a single-layer structure or a multilayer structure including different metal layers. For example, the gate electrode GE may include a triple-layer structure of molybdenum, aluminum, and molybdenum, a double-layer structure of copper and titanium, etc.

The insulation interlayer IL2 may be formed on the gate electrode GE. The insulation interlayer IL2 may be disposed on the gate insulation layer IL1 with covering the gate electrode GE. The insulation interlayer IL2 may insulate the source electrode SE and the drain electrode DE from the gate electrode GE.

The insulation interlayer IL2 may include an inorganic insulation layer, an organic insulation layer, or a combination thereof. For example, the insulation interlayer IL2 may include silicon oxide, silicon nitride, silicon carbide, or a combination thereof, or may include insulating metal oxide such as aluminum oxide, tantalum oxide, hafnium oxide, zirconium oxide, titanium oxide, etc. When the insulation interlayer IL2 includes the organic insulation layer, the insulation interlayer IL2 may include polyimide, polyamide, acrylic resin, phenol resin, benzocyclobutene (BCB), etc.

The source electrode SE and the drain electrode DE electrically connected to the source region SR and the drain region DR of the active pattern AP, respectively, may be formed on the insulation interlayer IL2. For example, each of the source electrode SE and the drain electrode DE may include Au, Ag, Al, Cu, Ni, Pt, Mg, Cr, W, Mo, Ti, or an alloy thereof, and may have a single-layer structure or a multilayer structure including different metal layers. For example, each of the source electrode SE and the drain electrode DE may include a triple-layer structure of molybdenum, aluminum, and molybdenum, a double-layer structure of copper and titanium, etc.

A planarization layer (or a passivation layer) IL3 may be formed on the source electrode SE and the drain electrode DE. The planarization layer IL3 may be disposed on the insulation interlayer IL2 with covering the source electrode SE and the drain electrode DE. The planarization layer IL3 may include an inorganic insulation layer, an organic insulation layer, or a combination thereof. For example, the planarization layer IL3 may have a single-layer structure or a multilayer structure including silicon nitride or silicon oxide. When the planarization layer IL3 includes the organic insulation layer, the planarization layer IL3 may include polyimide, polyamide, acrylic resin, phenol resin, BCB, etc.

The organic light emitting diode OLED may be formed on the planarization layer IL3. The organic light emitting diode OLED may include a first electrode E1, an emission layer EL, and a second electrode E2, which are sequentially stacked. The organic light emitting diode OLED may emit light based on a driving current receiving from the thin film transistor TR1 to display an image.

The first electrode E1 may be formed on the planarization layer IL3. The first electrode E1 may be connected to one of the source electrode SE and the drain electrode DE. For example, the first electrode E1 may be connected to the drain electrode DE. The first electrode E1 may be a pixel electrode of the display device. The first electrode E1 may be formed as a transmitting electrode or a reflective electrode depending on an emission type of the display device. If the first electrode E1 is formed as the transmitting electrode, the first electrode E1 may include indium tin oxide (ITO), indium zinc oxide (IZO), zinc tin oxide (ZTO), indium oxide ($In_2O_3$), zinc oxide (ZnO), tin oxide ($SnO_2$), etc. If the first electrode E1 is formed as the reflective electrode, the first electrode E1 may include Au, Ag, Al, Cu, Ni, Pt, Mg, Cr, W, Mo, Ti, etc., and may have a multilayer structure including the materials used in the transmitting electrode.

A pixel defining layer PDL may be formed on the planarization layer IL3. The pixel defining layer PDL may have an opening portion exposing at least a portion of the first electrode E1. For example, the pixel defining layer PDL may include organic insulation material.

The emission layer EL may be formed on the first electrode E1. The emission layer EL may be formed on an upper surface of the first electrode E1 exposed by the opening portion of the pixel defining layer PDL.

The emission layer EL may include a low molecular weight polymer or a high molecular weight polymer. For example, the emission layer EL may include copper phthalocyanine, N,N'-diphenylbenzidine, tris-(8-gydroxyquinoline)aluminum, etc., as the low molecular weight polymer. The emission layer EL may include poly(3,4-ethylenedioxythiophene), polyaniline, poly-phenylenevinylene, polyfluorene, etc., as the high molecular weight polymer.

In an exemplary embodiment, the emission layer EL may emit red light, green light, or blue light. In another exemplary embodiment, when the emission layer EL emit white light, the emission layer EL may have a multilayer structure including a red emission layer, a green emission layer, and a blue emission layer, or a single-layer structure including red emission material, green emission material, and blue emission material.

In an exemplary embodiment, a hole injection layer and/or a hole transport layer may be further formed between the first electrode E1 and the emission layer EL, or an electron transport layer and/or an electron injection layer may be further formed on the emission layer EL.

The second electrode E2 may be formed on the emission layer EL. The second electrode E2 may be a common electrode of the display device. The second electrode E2 may be formed as a transmitting electrode or a reflective electrode depending on an emission type of the display device. For example, when the second electrode E2 is formed as the transmitting electrode, the second electrode E2 may include lithium (Li), calcium (Ca), lithium fluoride (LiF), aluminum (Al), magnesium (Mg), or a combination thereof.

A thin film encapsulation layer TFE may be formed on the second electrode E2. The thin film encapsulation layer TFE may cover the organic light emitting diode OLED to protect the organic light emitting diode OLED from external materials. The thin film encapsulation layer TFE may include at least one inorganic layer and at least one organic layer. For example, the thin film encapsulation layer TFE may include a first thin film encapsulation layer TFE1 including inorganic material, a second thin film encapsulation layer TFE2 formed on the first thin film encapsulation layer TFE1 and including organic material, and a third thin film encapsulation layer TFE3 formed on the second thin film encapsulation layer TFE2 and including inorganic material.

The display device according to the exemplary embodiments may be applied to a display device included in a computer, a notebook, a mobile phone, a smartphone, a smart pad, a PMP, a PDA, an MP3 player, or the like.

Although certain exemplary embodiments and implementations of polycrystalline silicon substrates, methods of manufacturing the polycrystalline silicon substrates, and display devices made according to these exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a substrate;
    a first layer disposed on the substrate, the first layer including a first portion having a first thickness and a second portion having a second thickness greater than the first thickness;
    a second layer disposed on the first layer;
    an active pattern disposed on the second layer, the active pattern overlapping only the first portion of the first layer;
    a gate electrode disposed on the active pattern;
    a source electrode and a drain electrode disposed on the gate electrode, the source electrode and the drain electrode being connected to the active pattern;
    a first electrode connected to one of the source electrode and the drain electrode;
    a pixel defining layer disposed on the first electrode, the pixel defining layer having an opening portion exposing at least a portion of the first electrode;
    an emission layer in the opening portion disposed on the first electrode; and
    a second electrode disposed on the emission layer.

2. The display device of claim 1, wherein the second layer includes a third portion having a third thickness and a fourth portion having a fourth thickness less than the third thickness.

3. The display device of claim 2, wherein:
    the third portion of the second layer overlaps the first portion of the first layer, and
    the fourth portion of the second layer overlaps the second portion of the first layer.

4. The display device of claim 3, wherein the first thickness is less than the third thickness.

5. The display device of claim 1, wherein an upper surface of the second layer is substantially planarized.

6. The display device of claim 1, wherein the active pattern does not overlap the second portion of the first layer.

7. The display device of claim 1, wherein the first layer comprises a buffer layer comprising silicon nitride.

8. The display device of claim 1, wherein the second layer comprises a buffer layer comprising silicon oxide.

9. The display device of claim 1, wherein the first layer has a first hydrogen concentration and the second layer has a second hydrogen concentration, the first hydrogen concentration being greater than the second hydrogen concentration.

10. The display device of claim 1, wherein the active pattern comprises polycrystalline silicon.

11. The display device of claim 1, wherein the active pattern includes a source region and a drain region respectively connected to the source electrode and the drain electrode, and a channel region disposed between the source region and the drain region.

12. The display device of claim 1, wherein the first layer further includes an alignment mark.

13. A method of manufacturing a display device, the method comprising the steps of:
    forming on a substrate a first layer including a first portion having a first thickness and a second portion having a second thickness greater than the first thickness;
    forming a second layer on the first layer; and
    forming a polycrystalline silicon pattern overlapping only the first portion of the first layer on the second layer.

14. The method of claim 13, wherein the step of forming the first layer comprises the steps of:
    forming on the substrate a first inorganic layer having the second thickness with silicon nitride; and
    partially etching a portion of the first inorganic layer corresponding to the first portion.

15. The method of claim 14, wherein the step of forming the polycrystalline silicon pattern comprises the steps of:
    forming a polycrystalline silicon layer on the second layer; and
    etching a portion of the polycrystalline silicon layer overlapping only the second portion.

16. The method of claim 15, wherein the step of forming the polycrystalline silicon layer comprises the steps of:
    forming an amorphous silicon layer on the second layer; and
    crystallizing the amorphous silicon layer.

17. The method of claim 15, wherein the step of etching the portion of the polycrystalline silicon layer overlapping the second portion comprises the steps of:
    forming a second photoresist layer on the polycrystalline silicon layer;
    placing a second photomask on the second photoresist layer such that a second light transmitting portion of the second photomask corresponds to the second portion and a second light blocking portion of the second photomask corresponds to the first portion;
    exposing and developing the second photoresist layer to form a second photoresist pattern; and etching the polycrystalline silicon layer using the second photoresist pattern as an etch-stopper.

18. The method of claim 17, wherein the step of forming the first layer further comprises the step of forming an alignment mark, and wherein the second photomask is aligned with the first layer using the alignment mask.

19. The method of claim 14, wherein the step of partially etching the portion of the first inorganic layer corresponding to the first portion comprises the steps of:
 forming a first photoresist layer on the first inorganic layer;
 placing a first photomask on the first photoresist layer such that a first light transmitting portion of the first photomask corresponds to the first portion and a first light blocking portion of the first photomask corresponds to the second portion;
 exposing and developing the first photoresist layer to form a first photoresist pattern; and
 partially etching the first inorganic layer using the first photoresist pattern as an etch-stopper.

20. The method of claim 13, wherein the step of forming the second layer comprises the steps of:
 forming a second inorganic layer with silicon oxide on the first layer; and
 planarizing an upper surface of the second inorganic layer.

* * * * *